(12) United States Patent
Hillmann

(10) Patent No.: US 12,147,735 B2
(45) Date of Patent: Nov. 19, 2024

(54) METHOD FOR POINTER-BASED USER INTERACTION IN A CAE/CAD SYSTEM

(71) Applicant: AutoForm Engineering GmbH, Pfäffikon (CH)

(72) Inventor: Matthias Hillmann, Pfäffikon (CH)

(73) Assignee: AutoForm Engineering GmbH, Pfäffikon (CH)

( * ) Notice: Subject to any disclaimer, the term of this patent is extended or adjusted under 35 U.S.C. 154(b) by 0 days.

(21) Appl. No.: 17/811,442

(22) Filed: Jul. 8, 2022

(65) Prior Publication Data

US 2023/0008654 A1    Jan. 12, 2023

(30) Foreign Application Priority Data

Jul. 8, 2021   (CH) .................................. 70034/2021

(51) Int. Cl.
*G06F 30/12*   (2020.01)
*G06F 3/04812*  (2022.01)
*G06F 3/04845*  (2022.01)

(52) U.S. Cl.
CPC .......... *G06F 30/12* (2020.01); *G06F 3/04812* (2013.01); *G06F 3/04845* (2013.01)

(58) Field of Classification Search
CPC ............. G06F 3/04812; G06F 3/04845; G06F 3/04842; G06F 30/12; G06F 3/0481
See application file for complete search history.

(56) References Cited

U.S. PATENT DOCUMENTS

| 5,757,358 | A | 5/1998 | Osga | |
|---|---|---|---|---|
| 7,822,584 | B1 * | 10/2010 | Saebi | ...................... G06F 30/13 703/1 |
| 9,405,433 | B1 * | 8/2016 | Jackson | ................ G06F 3/0481 |
| 10,055,530 | B1 * | 8/2018 | Sinivaara | ............... B29C 64/112 |
| 2003/0060913 | A1 * | 3/2003 | Turner | .................... G06F 30/15 700/103 |

(Continued)

FOREIGN PATENT DOCUMENTS

EP         2728452 A2    5/2014

OTHER PUBLICATIONS

Cad Cam Tutorials, AutoCAD Hatch Command Tutorial Copmlete I AutoCAD Gradient Hatch Mar. 22, 2018, Youtube.com, https://www.youtube.com/watch?v=vl5xhCD5mXQ, pp. 1-19 (Year: 2018).*

(Continued)

*Primary Examiner* — Daniel W Parcher
(74) *Attorney, Agent, or Firm* — Oppedahl Patent Law Firm LLC

(57) ABSTRACT

A method for user interaction in a CAE/CAD system comprises displaying to a user a graphical user interface (2) with a model display region (3) and a control region (5) for controlling operation of the CAE/CAD system, and an accept button (9). The accept button (9) can be in an active state, signifying that the CAE/CAD system is ready to perform operations defined by user input when the accept button (9) is clicked. When the accept button (9) is in the active state, the CAE/CAD system graphically indicates to the user an extended apply region (11) which, when a clicking operation takes place inside it, will cause the CAE/CAD system to perform the same operations as when the accept button (9) is clicked.

12 Claims, 4 Drawing Sheets

(56) References Cited

U.S. PATENT DOCUMENTS

| | | | |
|---|---|---|---|
| 2005/0081161 A1* | 4/2005 | MacInnes | G06Q 30/01 |
| | | | 715/848 |
| 2014/0222384 A1* | 8/2014 | Nordmark | G06F 30/23 |
| | | | 703/1 |
| 2015/0268807 A1 | 9/2015 | Truong | |
| 2022/0155942 A1* | 5/2022 | Seki | G06F 3/04883 |

OTHER PUBLICATIONS

Ahmad Shadeed, Enhancing The Clickable Area Size, Aug. 13, 2019, ishadeed.com, https://ishadeed.com/article/clickable-area/, pp. 1-13 (Year: 2019).*

Autoform: Early part assessment with AutoForm (Aug. 31, 2020) Aug. 31, 2020 www.youtube.com/watch?v=edD-bog_u58.

* cited by examiner

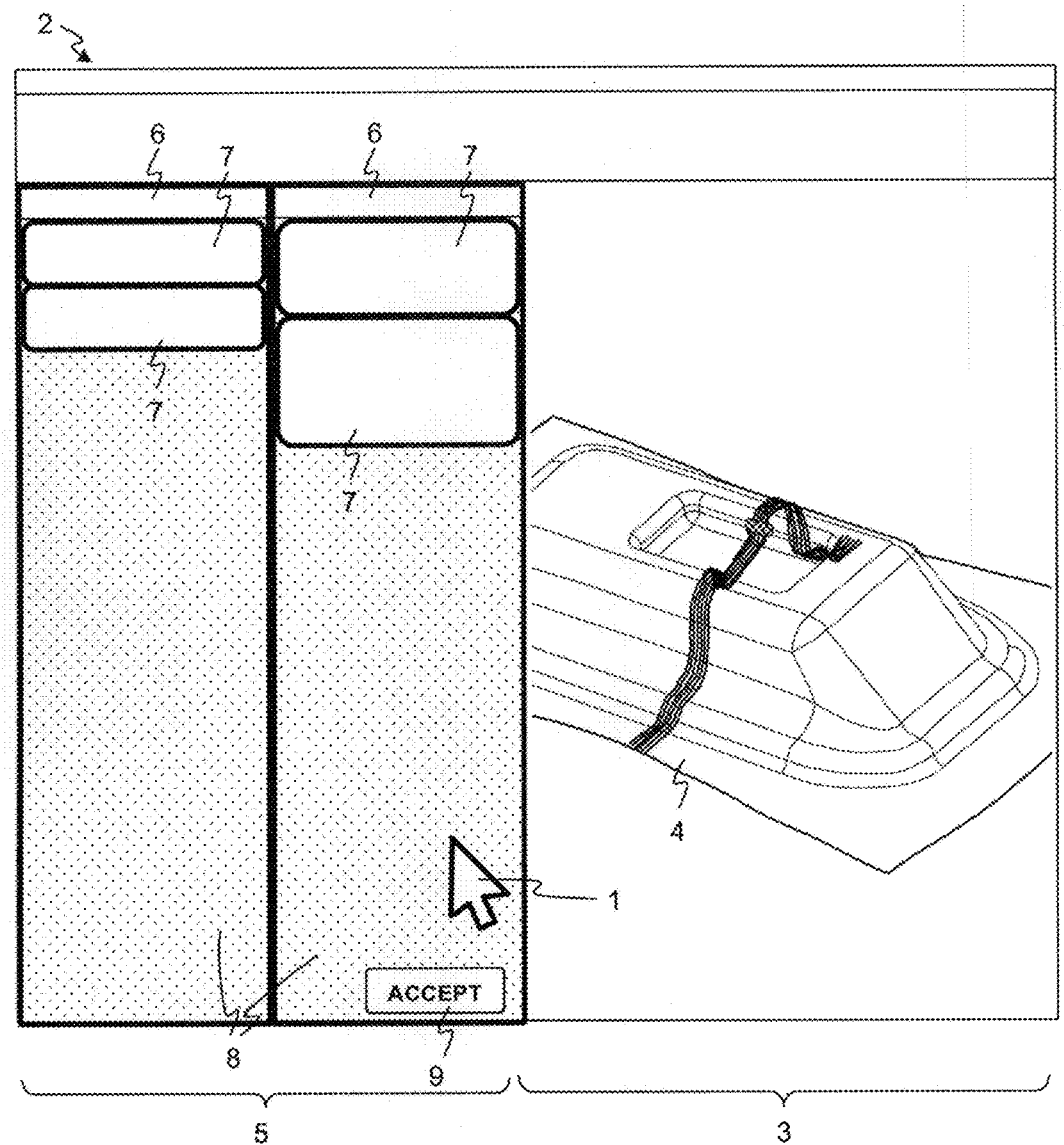
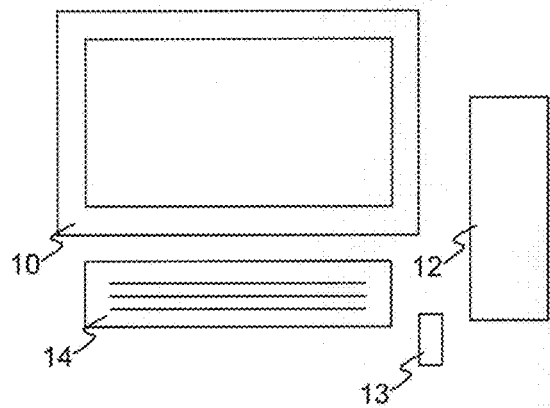
Fig. 2

METHOD FOR POINTER-BASED USER INTERACTION IN A CAE/CAD SYSTEM

Swiss patent application number 070034/2021, filed 8 Jul. 2021, is incorporated herein for all purposes.

The invention relates to the field of Computer Aided Engineering and/or Computer Aided Design (CAE/CAD) systems, and in particular to a method for user interaction in a CAE/CAD system as described in the preamble of the corresponding independent claims.

BACKGROUND

In CAE/CAD systems it often is the case that as user repeatedly performs user interface actions to choose objects or elements being modelled, choosing operations to be performed on these objects or elements, choosing parameters for these operations, and then triggering execution of the operations. When the CAE/CAD system is in a state when an operation is sufficiently defined and compatible with the associated object(s) or element(s), and thus are ready to be executed, this can be indicated by the CAE/CAD system activating an "ACCEPT" button. The user clicks the accept button, which triggers execution of the operation. As this cycle of selecting and accepting input information and thereby applying operations is repeated, the user is subject to a certain strain, both with regard to concentration, hand-eye coordination and mouse movement, caused by having to click on the accept button each time. This could be alleviated by associating a key on a physical keyboard or a special mouse button, using a mouse with such additional buttons, with the accept operation, but this would break a GUI paradigm based only on GUI elements and mouse operations.

It is therefore an object of the invention to create a method for user interaction in a CAE/CAD system of the type mentioned initially, which overcomes the disadvantages mentioned above.

SUMMARY OF THE INVENTION

These objects are achieved by a method for user interaction in a CAE/CAD system according to the independent claim.

The term "CAE/CAD system" used herein is understood to denote Computer Aided Engineering systems and/or Computer Aided Design systems.

The method for user interaction in a CAE/CAD system is performed by a processing unit of the CAE/CAD system. The method comprises the step of:
displaying to a user, on a computer display,
a graphical user interface, the graphical user interface comprising a model display region for displaying a graphical model representation and
a control region for displaying widgets for controlling operation of the CAE/CAD system,
the control region comprising an area covered by the widgets (active control region) and an inactive control region, not covered by the widgets.

Therein, the graphical user interface comprising an accept button.

The method comprises the further steps of:
on the basis of user input, graphically indicating that the accept button is in an active state, as opposed to an inactive state, the active state signifying that the CAE/CAD system is ready to perform operations defined by the user input when the accept button is clicked,
when the accept button is in the active state, graphically indicating an extended apply region which, when a clicking operation takes place inside it, will cause the CAE/CAD system to perform the same operations as when the accept button is clicked.

This makes it significantly easier for the user to trigger these operations, also to be called "accept operations", using the mouse alone. The effort for moving the mouse pointer to the accept button and click it is eased, since a much larger area is available for clicking. A screen area that otherwise is inactive, in the sense that it is not used for user input, or, more specifically, does not react to mouse events, is made available for triggering the accept operations.

In the context of this application, the terms "accept button" and "apply region" are used, in order to avoid confusion that might be caused if the region were called "accept region".

The control region comprising widgets means that a display area showing the control region is covered at least in part by display areas showing the widgets. The inactive control region is part of the control region. It corresponds to a region of the control region that is left when the widgets are displayed in the control region. The number and size of widgets depends on a state of user interaction, growing and shrinking, causing the inactive control region to shrink and grow, respectively.

In embodiments, the extended apply region lies within the inactive control region.

The extended apply region can be shaped as a rectangular button, larger than the accept button, and sized to cover a substantial area of the extended apply region. It can be substantially larger than the accept button, in particular with at least twice or four or eight times the area of the accept button. It can replace the accept button, which from another point of view is the same as increasing the size of the accept button.

In embodiments, the extended apply region is the entirety of the inactive control region. This gives the user a spatial and visual guide as to where to perform the clicking operation.

In embodiments, the extended apply region comprises regions of the graphical user interface that are not associated with the clicking operation for other purposes. This gives the user a maximal area in which to perform the clicking operation.

In embodiments, graphically indicating the extended apply region comprises graphically modifying the pointer. This allows to give the user a discreet, unobtrusive indication as to the state of the accept button. It is particularly effective since the user's attention is often focused on or around the pointer.

In embodiments, graphically modifying the pointer comprises modifying one or more of the pointer's shape, colour, pattern, brightness, blinking frequency.

In embodiments, graphically modifying the pointer comprises modifying it only when lies within the extended apply region. The pointer lying in a region means that the pointer's hotspot or active pixel lies within the region. This allows to give the user a discreet, unobtrusive confirmation that the pointer is inside the extended apply region.

In embodiments, graphically indicating the extended apply region comprises graphically modifying the extended apply region. This can be done alternatively or in addition to modifying the pointer, and gives the user a visual guide to the location of the extended apply region.

In embodiments, graphically modifying the extended apply region comprises modifying one or more of the extended apply region's colour, pattern, brightness, blinking frequency.

In embodiments, graphically modifying the extended apply region comprises modifying it only when the pointer lies within it. This allows to give the user a confirmation that the pointer is inside the extended apply region.

In embodiments, the accept button lies within the control region.

In embodiments, the method comprises the step of, upon the user performing a clicking operation in the extended apply region, performing the operations defined by the user input.

The clicking operation can be a single click, double click, etc.

In embodiments, in the course of use of the graphical user interface, a display region covered by the widgets is modified, and the inactive control region is modified accordingly.

In embodiments, the design system is a CAE/CAD system for designing parts shaped by forming processes or for designing tools used in forming processes, or for designing forming processes.

A data processing system can be programmed to perform the method for user interaction in a CAE/CAD system. In an embodiment, a computer program product for user interaction in a CAE/CAD system is loadable into an internal memory of a digital computer or a computer system, and comprises computer-executable instructions to cause one or more processors of the computer or computer system execute the method for user interaction in a CAE/CAD system. In another embodiment, the computer program product comprises a computer readable medium having the computer-executable instructions recorded thereon. The computer readable medium preferably is non-transitory; that is, tangible. In still another embodiment, the computer program is embodied as a reproducible computer-readable signal, and thus can be transmitted in the form of such a signal. A method of manufacturing a non-transitory computer readable medium, comprises the step of storing, on the computer readable medium, computer-executable instructions which when executed by a processor of a computing system, cause the computing system to perform the method for user interaction in a CAE/CAD system.

Further embodiments are evident from the dependent patent claims.

DESCRIPTION OF THE DRAWINGS

The subject matter of the invention will be explained in more detail in the following text with reference to exemplary embodiments which are illustrated in the attached drawings, which schematically show:

FIG. 1 a graphical user interface;

FIG. 2 a computer providing the graphical user interface;

In principle, identical parts are provided with the same reference symbols in the figures.

DETAILED DESCRIPTION

Figure 3:
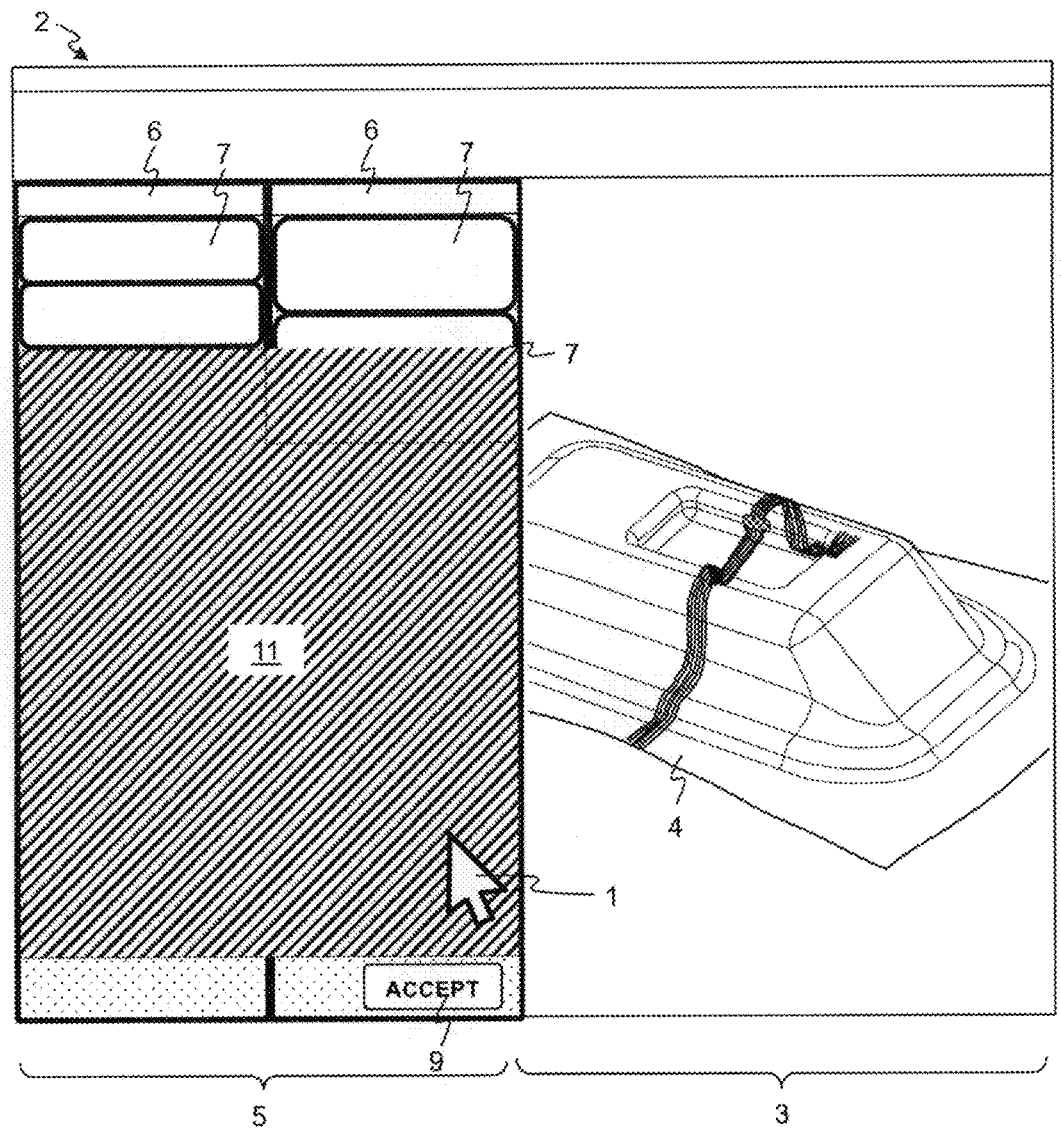
FIG. 3 the graphical user interface with an extended apply region.

FIG. 1 schematically shows a computer display 10. A graphical user interface 2 of a CAE/CAD system is displayed on the computer display 10. The graphical user interface 2 comprises a model display region 3, on which a graphical representation of computer model of an object being designed is displayed. The graphical user interface 2 further comprises a control region 5 in which widgets 7 defining parameters of the computer model or of operations performed on the computer model are displayed. The widgets 7 can be arranged in containers 6 according to various GUI paradigms. According to certain GUI paradigms, a screen or display area covered by a widget 7 or a set of widgets 7 being displayed can vary. For example, in an accordion container 6 widgets 7 are arranged vertically above one another, and each widget 7 can be expanded or collapsed in the vertical direction, or widgets 7 can be displayed in the container 6 or removed, depending on the state of the graphical user interface 2. The widgets 7 can contain GUI controls, that is, visual elements which allow the user to enter, change or delete data. Such controls can be input fields, sliders, check boxes, radio buttons, up/down arrows (spinners) and the like. They are not drawn in FIG. 1.

Further, well known, elements of a computer system that can be used to control the computer system and the CAE/CAD system running on it are, in addition to the computer display 10, a processing unit 12, a pointing device 13 and an input device such as a keyboard 14, as shown in FIG. 2.

As a user interacts with the graphical user interface 2, a typical sequence of interaction can be:

The user selects an element of a part represented in the CAE/CAD system. This can happen by selecting the element in its visual representation in the graphical model representation 4, or in an object navigation panel, such as an object tree, displayed in one of the containers 6. Depending on the selection, the object navigation panel may use more or less screen area, for example in the left one of the two vertically extended containers 6 shown in the graphical user interface 2, and correspondingly, an inactive control region 8 at the bottom of this container 6 will shrink and grow.

Furthermore, depending on the selection, operations that can be performed on the selected element are automatically determined by the CAE/CAD system and presented to the user, The user selects an operation to be performed on the element, and controls for this operation are displayed by widgets 7 in the right one of the two vertically extended containers 6. Here too, depending on the number and kind of operations, an inactive control region 8 at the bottom of this container 6 will shrink and grow.

The user adapts parameters controlled by the controls for the selected operation, or leaves default parameters unchanged.

If the combination of selected element, operation and parameters is feasible, the CAE/CAD system indicates that an accept button 9 is in an active state.

The user, using the pointing device 13, clicks the accept button 9. This causes the selected operation, with these parameters, to be applied to the selected element.

This sequence of interactions is repeated over and over, and if user operations are done predominantly using the pointing device 13, clicking the accept button 9 becomes a repetitive task, requiring concentration and hand-eye coordination.

In order to simplify this task and reduce the coordinative burden on the user, the invention takes advantage of the fact, when the graphical user interface 2 is in a state that the accept button 9 can be pressed, certain regions of the graphical user interface 2 do not serve any purpose for accepting input. That is, a clicking operation in such a region normally would be ignored, and would not trigger any action in the CAE/CAD system. Such regions can be the inactive control regions 8 of the containers 6, where no widgets 7 are displayed, or a background region in the model display region 3, where no part of the graphical model representation 4 is shown.

Such regions that are not used for any other clicking operations are used as extended apply region 11. This means that a clicking operation in the extended apply region 11 will have the same effect as clicking the accept button 9. The clicking operation can be a single click, or, in order to avoid errors, a double click. The clicking operation can use the main mouse button, or another mouse button, depending on a configuration of the GUI.

FIG. 3 shows the graphical user interface 2 with an extended apply region 11 covering the inactive control regions 8 of the two vertically extended containers 6. The extended apply region 11 is indicated by diagonal hatching only for the purpose of illustration in this Figure. In the real graphical user interface 2, the extended apply region 11 need not be covered with such a hatching.

Figure 4:
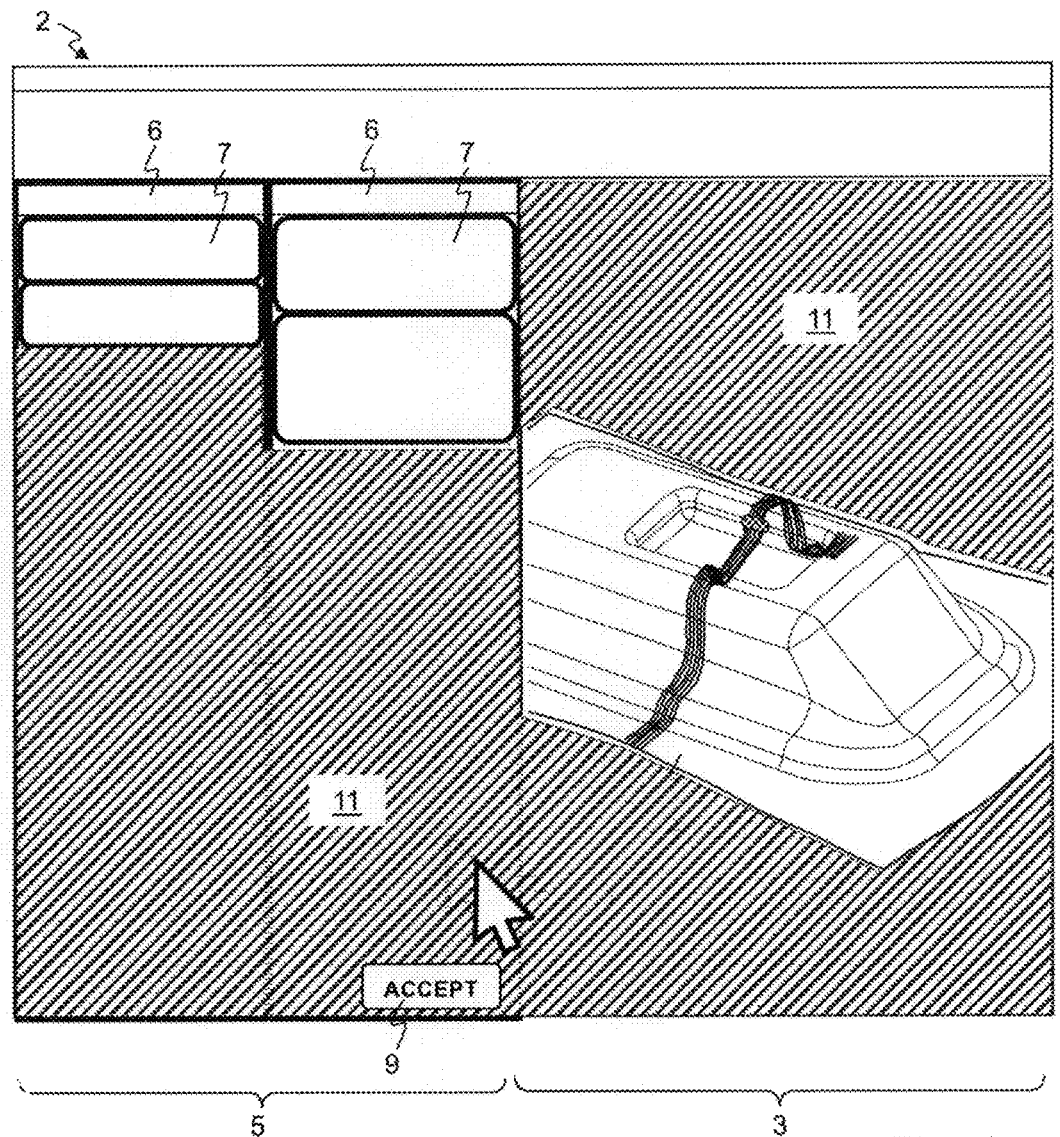
FIGS. 4-5 the graphical user interface with the extended apply region according to other embodiments.

FIG. 4 shows the graphical user interface 2 with the extended apply region 11 covering an otherwise unused background region of the model display region 3 as well.

Figure 5:
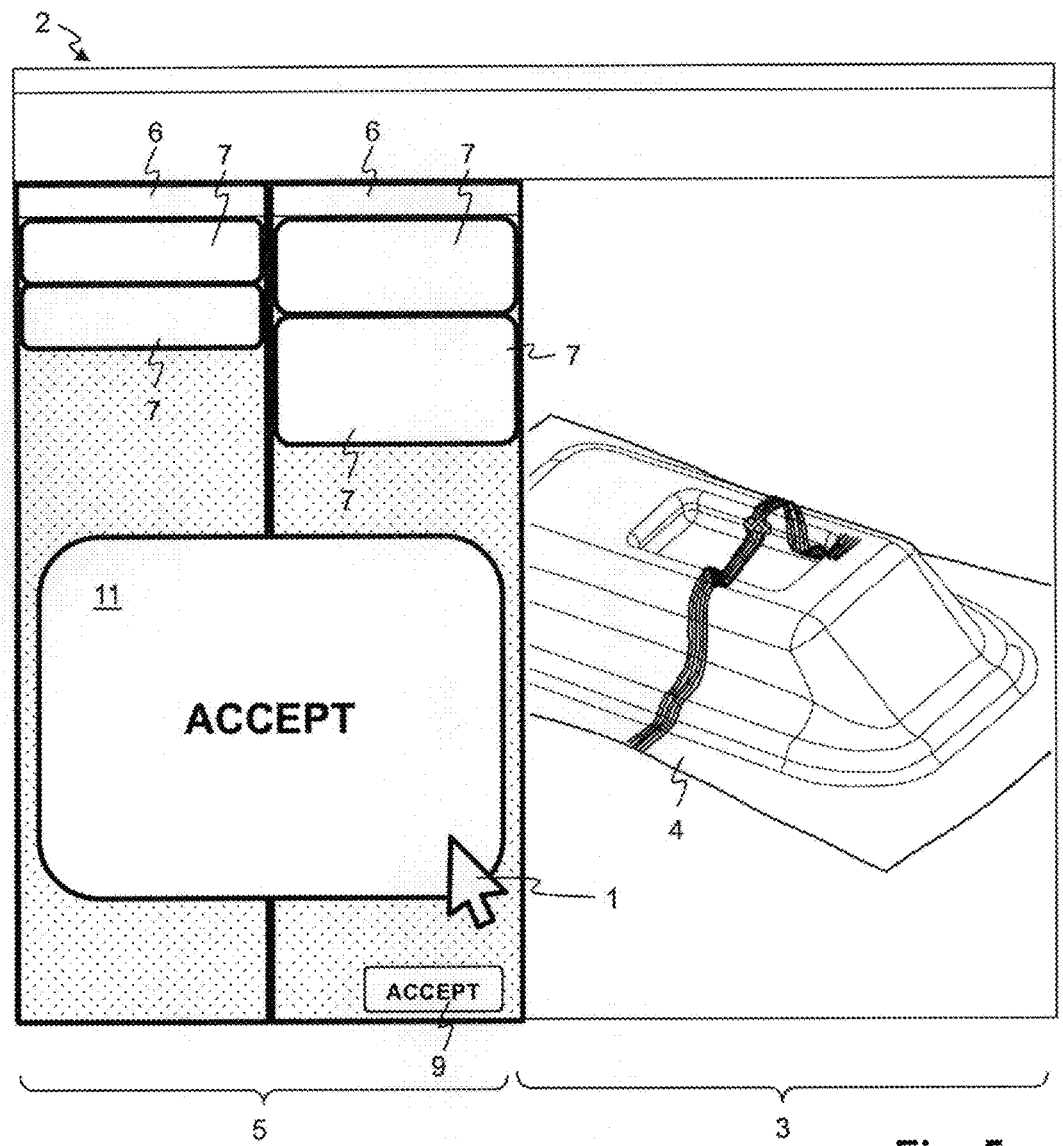

FIG. 5 shows the graphical user interface 2 with the extended apply region 11 in the shape of a large button. The button can be automatically resized by the CAE/CAD system according to the shape of the inactive control regions 8.

In order to indicate to the user, once that the accept button 9 is in the active state, that the mouse pointer 1 is in the extended apply region 11, different approaches are possible, alone or in combination:

Modifying the visual appearance of the pointer 1 when it is inside the extended apply region 11. This can be by modifying one or more of the pointer's 1 shape, colour, pattern, brightness, blinking frequency. For example, a contour line of the pointer can be set to have a different colour than under other conditions.

Modifying the visual appearance of extended apply region 11 when the accept button 9 is in the active state. This can be by modifying one or more of the extended apply region's colour, pattern, brightness, blinking frequency.

Modifying the visual appearance of extended apply region 11 when the accept button 9 is in the active state and only when the pointer 1 is inside the extended apply region 11. This can be by modifying one or more of the extended apply region's colour, pattern, brightness, blinking frequency.

As a rule, such modifications of the pointer 1 and/or the extended apply region 11 should be recognizable but unobtrusive. For example, large changes in brightness or colour of a large area of the graphical user interface 2 would be annoying to a user.

While the invention has been described in present embodiments, it is distinctly understood that the invention is not limited thereto, but may be otherwise variously embodied and practised within the scope of the claims.

The invention claimed is:

1. A method for user interaction in a CAE/CAD system, performed by a processing unit of the CAE/CAD system, the method comprising the steps of:
　displaying to a user, on a computer display,
　　a graphical user interface, the graphical user interface comprising a model display region for displaying a graphical model representation; and
　　a control region, outside of the model display region, for displaying widgets containing GUI controls for controlling operation of the CAE/CAD system,
　　and displaying in the control region an active control region containing the widgets and an inactive control region, wherein no widgets and no GUI controls are displayed in the inactive control region;
　the active control region comprising an accept button smaller than the inactive control region;
　receiving first user input adapting at least one parameter controlled by a GUI control of the widgets to define accept operations, which are operations to be applied by the CAE/CAD system to an object or element being modelled;
　on the basis of the first user input, graphically indicating that the accept button is in an active state, as opposed to an inactive state, the active state signifying that the CAE/CAD system is ready to apply the accept operations to the object or element being modelled in response to clicking on the accept button;
　in response to the clicking on the accept button, causing the CAE/CAD system to apply the accept operations to the object or element being modelled;
　when the accept button is in the active state, changing the inactive control region into a graphically indicated extended apply region, wherein the entire extended apply region can accept a second user input, whereby, the second user input will cause the CAE/CAD system to apply the accept operations to the object or element being modelled identically as if the accept button, still displayed in the active control region, had been clicked.

2. The method of claim 1, wherein the extended apply region comprises regions of the graphical user interface that are not associated with a clicking operation for other purposes.

3. The method of claim 1, wherein graphically indicating the extended apply region comprises graphically modifying the pointer.

4. The method of claim 3, wherein graphically modifying the pointer comprises modifying one or more of the pointer's shape, colour, pattern, brightness, blinking frequency.

5. The method of claim 3, wherein graphically modifying the pointer comprises modifying it only when it lies within the extended apply region.

6. The method of claim 1, wherein graphically indicating the extended apply region comprises graphically modifying the extended apply region.

7. The method of claim 6, wherein graphically modifying the extended apply region comprises modifying one or more of the extended apply region's colour, pattern, brightness, blinking frequency.

8. The method of claim 6, wherein graphically modifying the extended apply region comprises modifying it only when the pointer lies within it.

9. The method of claim 1, wherein, in the course of use of the graphical user interface, a display region covered by the widgets is modified, and the inactive control region is modified accordingly.

10. A data processing system comprising at least a computer display, a processing unit and a pointing device, the data processing system being programmed to operate as a CAE/CAD system and to perform the method according to claim 1.

11. A non-transitory computer readable medium comprising computer readable program code encoding a computer program that, when loaded and executed on a computer, causes the computer to operate as a CAE/CAD system and to execute the method according to claim 1.

12. A method of manufacturing a non-transitory computer readable medium, comprising the step of storing, on the computer readable medium, computer-executable instructions which when executed by a processor of a computing system, cause the computing system operate as a CAE/CAD system and to perform the method steps of claim 1.

\* \* \* \* \*